United States Patent

Baumann et al.

Patent Number: 5,296,567
Date of Patent: Mar. 22, 1994

[54] THERMOCURABLE COMPOSITIONS

[75] Inventors: Dieter Baumann, Möhlin; Werner Margotte, Lupsingen; Beat Müller, Marly, all of Switzerland

[73] Assignee: Ciba-Geigy Corporation, Ardsley, N.Y.

[21] Appl. No.: 863,638

[22] Filed: Apr. 6, 1992

[30] Foreign Application Priority Data

Apr. 8, 1991 [CH] Switzerland .......................... 1029/91

[51] Int. Cl.$^5$ .......................... C08F 4/06; C08F 4/20; C08G 59/68; C08G 8/04
[52] U.S. Cl. .................................... 526/172; 526/192; 528/90; 528/92; 528/139; 528/143; 528/356; 528/357; 528/358; 528/361; 528/365; 528/366; 528/371; 528/393; 528/408; 528/409; 525/327.3
[58] Field of Search .................... 528/90, 92, 139, 143, 528/356, 357, 358, 361, 365, 366, 371, 393, 408, 409, 55, 56, 57, 58; 526/172, 192; 252/182.2, 182.28, 182.23; 525/327.3

[56] References Cited

U.S. PATENT DOCUMENTS

| | | | |
|---|---|---|---|
| 3,677,978 | 7/1972 | Dowbenko et al. | 528/92 |
| 4,058,400 | 11/1977 | Crivello | 96/86 |
| 4,058,401 | 11/1977 | Crivello | 96/115 |
| 4,069,055 | 1/1978 | Crivello | 96/115 |
| 4,473,674 | 9/1984 | Stoakley et al. | 523/454 |
| 4,554,342 | 11/1985 | Corley | 528/90 |
| 5,013,814 | 5/1991 | Roth et al. | 528/90 |
| 5,130,406 | 7/1992 | Muller et al. | 528/92 |

FOREIGN PATENT DOCUMENTS 0379464  7/1990  European Pat. Off.
9011303 10/1990  World Int. Prop. O.

OTHER PUBLICATIONS

Derwent Abstract: J612-83168.
Lee & Neville "Handbook of Epoxy Resins" pp. 7-2, 5-22, 1982.
Kirk-Othmer "Encyclopedia of Chemical Technology" vol. 9, 3rd ed. p. 279.
Lange's Handbook of Chemistry, John A. Dean, 13th Edition (1985), Section 5, Tables 5-6 and 5-7.
Chemical Abstract 114(18):165092s.
Chemical Abstract 99:141034v.
Chemical Abstract 99:141033u.
Derwent Abst. 35543 K/15.

Primary Examiner—John Kight, III
Assistant Examiner—Richard Jones
Attorney, Agent, or Firm—William A. Teoli, Jr.

[57] ABSTRACT

The present document describes the use of an inhibitor for cationic polymerization as an additive to a thermocurable composition based on at least one cationically polymerizable organic material and an initiator for cationic polymerization in the form of an onium compound or a compound of the formula (I)

$$[M^{+n}(L)_x]^{n+} nX^- \qquad (I),$$

in which n is 2 or 3, M is a metal cation selected from the group comprising $Zn^{2+}$, $Mg^{2+}$, $Fe^{2+}$, $Co^{2+}$, $Ni^{2+}$, $Cr^{2+}$, $Ru^{2+}$, $Mn^{2+}$, $Sn^{2+}$, $VO^{2+}$, $Fe^{3+}$, $Al^{3+}$ and $Co^{3+}$, $X^-$ is an anion selected from the group comprising $PF_6^-$, $AsF_6^-$, $SbF_6^-$, $BiF_6^-$, derivatives of these anions in which at least one fluorine atom has been replaced by a hydroxyl group, and $CF_3SO_3^-$, or in which up to 50% of the anions $X^-$, based on the total amount of anions, may be any desired anions, L is water or an organic σ-donor ligand which contains, as bonding sites, one or more functional radicals selected from the group comprising —CO—, —CO—O—, —O—CO—O— and —O— and forms σ-bonds with the central atom via the oxygen atom or atoms, and x is an integer from 0 to 6, and where the ligands L may be different within said definitions, or as an additive to components for the preparation of a composition of this type for avoiding initiator decomposition products which are formed due to moisture and reduce the thermal stability of the composition, and/or for increasing the thermal stability of the composition for a limited time before curing.

14 Claims, No Drawings

THERMOCURABLE COMPOSITIONS

The invention relates to the use of an inhibitor for cationic polymerisation as an additive to a thermocurable composition based on at least one cationically polymerisable organic material and an initiator for cationic polymerisation in the form of an onium compound or a compound of the formula (I)

$$[M^{+n}(L)_x]^{n+} nX^- \quad (I),$$

in which n is 2 or 3, M is a metal cation selected from the group comprising $Zn^{2+}$, $Mg^{2+}$, $Fe^{2+}$, $Co^{2+}$, $Ni^{2+}$, $Cr^{2+}$, $Ru^{2+}$, $Mn^{2+}$, $Sn^{2+}$, $VO^{2+}$, $Fe^{3+}$, $Al^{3+}$ and $Co^{3+}$, $X^-$ is an anion selected from the group comprising $PF_6^-$, $AsF_6^-$, $SbF_6^-$, $BiF_6^-$, derivatives of these anions in which at least one fluorine atom has been replaced by a hydroxyl group, and $CF_3SO_3^-$, or in which up to 50% of the anions $X^-$, based on the total amount of anions, may be any desired anions, L is water or an organic σ-donor ligand which contains, as bonding sites, one or more functional radicals selected from the group comprising —CO—, —CO—O—, —O—CO—O— and —O— and forms σ-bonds with the central atom via the oxygen atom or atoms, and x is an integer from 0 to 6, and where the ligands L may be different within said definitions, or as an additive to components for the preparation of a composition of this type. The invention furthermore relates to corresponding compositions, to a process for the preparation of the compositions described, to the preferred uses of these compositions, and to an initiator-free subcomponent for the preparation of these compositions.

Cationically curable compositions containing onium salts as initiator compounds, e.g. organic phosphonium, ammonium, halonium and in particular sulfonium salts, have been described in large number and are employed today for a wide variety of applications, for example in liquid form as casting compounds or in solid form as compression moulding compounds.

Likewise, cationically curable compositions containing initiator compounds of the abovementioned formula (I) have already been disclosed and are described in EP-A-0 388 837.

However, said compositions have disadvantages.

Thus, after relatively long and/or inappropriate storage, in particular under excessively moist conditions, the curing reaction frequently commences even at temperatures significantly lower than those measured for compositions which are identical, but have been prepared from fresh components. This is particularly true of solvent-containing compositions, even if the two-component principle is used, if the curing agent component contains the initiator in dissolved or dispersed form. Furthermore, after long storage of the curing agent component, a sharp increase in viscosity frequently takes place immediately after the curing agent and monomer component are mixed, even if the compositions are exposed to only moderate heating, or none at all, and are handled for example at room temperature. This increase in viscosity can make it very difficult or even impossible to fill casting moulds of intricate shape with such compositions.

It would frequently also be desirable if it were possible to heat the compositions briefly at relatively high temperatures during preparation or application without this causing curing to commence:

This is because use, for example, of some cationically polymerisable materials for casting applications is only possible, if at all, if large amounts of diluents are used since the material would, at temperatures below those at which significant curing commences after only a short time, still be much too viscous for clean casting of the compositions; however, these large amounts of diluents adversely affect the properties of the cured material.

Early commencement of the curing reaction can also cause problems in the preparation of solid compositions of the type mentioned at the outset, for example of powder coating mixtures. This is because the homogeneous mixing, necessary for subsequent uniform curing, of the initiator with the solid polymerisable material is generally likewise achieved at elevated temperature with the aid of melt homogenisation of the components. However, many of the initiator compounds mentioned at the outset cannot be incorporated really well and homogeneously into the solid cationically polymerisable material using this widespread technique, since curing of the composition would again commence before completion of the time necessary for homogenisation.

In both the abovementioned cases, however, the temperature necessary for subsequent curing of the composition should of course not increase to a significant extent, or not at all.

It has now been found that the thermal curing reaction of a composition based on cationically polymerisable material and polymerisation initiators in the form of onium compounds or compounds of the above formula (I) can be controlled by the addition of suitable amounts of a polymerisation inhibitor in such a manner that stability problems, such as those mentioned above, do not occur. This is because the use of a polymerisation inhibitor as an additive to said compositions allows, in particular, initiator decomposition products formed due to moisture to be reacted so that they no longer affect the processing and curing of the compositions. Furthermore, the thermal stability of the compositions can be increased in this way for a limited time.

The present invention therefore relates to the use of an inhibitor for cationic polymerisation as an additive to a thermocurable composition based on at least one cationically polymerisable organic material and an initiator for cationic polymerisation in the form of an onium compound or a compound of the formula (I)

$$[M^{+n}(L)_x]^{n+} nX^- \quad (I),$$

in which n is 2 or 3, M is a metal cation selected from the group comprising $Zn^{2+}$, $Mg^{2+}$, $Fe^{2+}$, $Co^{2+}$, $Ni^{2+}$, $Cr^{2+}$, $Ru^{2+}$, $Mn^{2+}$, $Sn^{2+}$, $VO^{2+}$, $Fe^{3+}$, $Al^{3+}$ and $Co^{3+}$, $X^-$ is an anion selected from the group comprising $PF_6^-$, $AsF_6^-$, $SbF_6^-$, $BiF_6^-$, derivatives of these anions in which at least one fluorine atom has been replaced by a hydroxyl group, and $CF_3SO_3^-$, or in which up to 50% of the anions $X^-$, based on the total amount of anions, may be any desired anions, L is water or an organic σ-donor ligand which contains, as bonding sites, one or more functional radicals selected from the group comprising —CO—, —CO—O—, —O—CO—O— and —O— and forms σ-bonds with the central atom via the oxygen atom or atoms, and x is an integer from 0 to 6, and where the ligands L may be different within said definitions, or as an additive to components for the preparation of a composition of this type for avoiding initiator decomposition products which are formed due to moisture and reduce the thermal stability of the composition, and/or for increasing the thermal stability of the composition for a limited time before curing.

The present invention furthermore relates to a thermocurable composition which comprises at least the following components:

a) a cationically polymerisable organic material, b) an initiator for cationic polymerisation in the form of an onium compound or a compound of the formula (I)

$$[M^{+n}(L)_x]^{n+} nX^-  \quad (I),$$

in which n is 2 or 3, M is a metal cation selected from the group comprising $Zn^{2+}$, $Mg^{2+}$, $Fe^{2+}$, $Co^{2+}$, $Ni^{2+}$, $Cr^{2+}$, $Ru^{2+}$, $Mn^{2+}$, $Sn^{2+}$, $VO^{2+}$, $Fe^{3+}$, $Al^{3+}$ and $Co^{3+}$, $X^-$ is an anion selected from the group comprising $PF_6^-$, $AsF_6^-$, $SbF_6^-$, $BiF_6^-$, derivatives of these anions in which at least one fluorine atom has been replaced by a hydroxyl group, and $CF_3SO_3^-$, or in which up to 50% of the anions $X^-$, based on the total amount of anions, may be any desired anions, L is water or an organic $\sigma$-donor ligand which contains, as bonding sites, one or more functional radicals selected from the group comprising —CO—, —CO—O—, —O—CO—O— and —O— and forms $\sigma$-bonds with the central atom via the oxygen atom or atoms, and x is an integer from 0 to 6, and where the ligands L may be different within said definitions, c) a polymerisation inhibitor in such a small amount that sufficient initiator b) unaffected by it remains to effect the desired curing of the composition.

Suitable polymerisation inhibitors are generally compounds which are more highly nucleophilic than the cationically polymerisable material used and react with the protons in the composition or with the cations of the growing polymer chain more rapidly than do the monomers of the polymerisable material used, so that protons and cations cannot initiate polymerisation of this material.

The polymerisation inhibitors are in particular bases which neutralise the strong Brönsted acids formed by the initiator compounds on thermal curing, but also during storage, due to decomposition caused by moisture or impurities, for example in the solvent or dispersing agent of the initiator component, in the sense of an acid/base reaction. Since said Brönsted acids are generally very strong acids, such as $HSbF_6$ or $HPF_6$, the base employed here can also be selected from many compounds which are acidic in water, for example tetrabutylammonium hydrogen sulfate. Preference is given to bases whose strength corresponds to a $pK_a$ value of from about 2 to about 12 (at 25° C. in water). Examples of such bases can easily be found in the usual chemical tables, for example Lange's Handbook of Chemistry (Editor John A. Dean), 13th Edn. (1985), McGraw-Hill Book Company, New York, section 5, Tables 5-6 and 5-7. The bases employed according to the invention may be solid, such as basic fillers, e.g. unwashed aluminum oxide trihydrate, or liquid, like many amines.

Amines represent a group of polymerisation inhibitors which is particularly preferred according to the invention. These amines should preferably have a $pK_a$ value of from 2 to 9 (25° C. in water). Primary, secondary and tertiary amines are suitable. In addition, the term "amine" here should also be taken to include heterocyclic compounds in which the amine nitrogen is a member of the heterocyclic ring, e.g. pyrazoles, imidazoles, pyrrolidines, pyrrolines, imidazolidines, imidazolines, pyrazolidine, pyrazolines, piperidines, piperazines, indolines, morpholines, quinuclidine, 1,8-diazabicyclo[5.4.0]undec-7-ene, 1,5-diazabicyclo[4.3.0]non-5-ene and 1,4-diazabicyclo[2.2.2]octane.

Particular preference is given to secondary and in particular tertiary amines, very particularly tribenzylamine, 1-methylimidazole, 1,8-diazabicyclo[5.4.0]undec-7-ene, 1,5-diazabicyclo[4.3.0]non-5-ene and 1,4-diazabicyclo[2.2.2]octane.

Amines which are particularly highly suitable for the invention are those selected from the group comprising:

($c_1$) aromatic amines containing one to four $NH_2$ groups and having at least one substituent in the ortho-position to each amino group, where the substituent is $C_1-C_{10}$alkyl, $C_1-C_{10}$alkoxy, $C_5-C_6$cycloalkyl, $C_6-C_{10}$aryl or halogen, with the proviso that the amine is not halogen-substituted in both ortho-positions to an amino group, and ($c_2$) aromatic amines containing 1 to 4 $NH_2$ groups and having one ortho- or para-substituent to each amino group present, where the substituent is —COOH, —COOR, —COR, —SO$_2$R or —SOR, and R is $C_1-C_{10}$alkyl, $C_5-C_6$cycloalkyl, $C_6-C_{10}$aryl, aminoaryl or —R'—OOC—$C_6H_4$—$NH_2$ where R' is alkylene.

Compounds of this type containing 2, 3 or 4 $NH_2$ groups can be prepared, for example, by condensation of an appropriately substituted aniline with an aldehyde or ketone, for example with formaldehyde [subgroup ($c_1$)] or by reaction of an amino acid with a compound containing 2-4 OH groups capable of ester condensation [subgroup ($c_2$)].

The aromatic amines of subgroups ($c_1$) and ($c_2$) may be monocyclic or bicyclic. The bicyclic compounds may contain both fused and unfused rings.

The alkyl substituents and the alkyl groups of the alkoxy substituents of the amines of subgroup ($c_1$) may be straight-chain or branched. Examples of suitable alkyl groups are methyl, ethyl, n- and isopropyl, butyl, pentyl, hexyl, octyl and decyl. Examples of suitable alkoxy groups are the alkoxy groups corresponding to these alkyl radicals. Examples of suitable cycloalkyl groups are cyclopentyl and cyclohexyl. Examples of suitable aryl groups are phenyl and naphthyl. Suitable halogen substituents are iodine, bromine and in particular chlorine.

Preferred amines of subgroup ($c_1$) have one or two $NH_2$ groups and a $pK_a$ value of 3-4.5 and contain at least one alkyl substituent in the ortho-position to each amino group. Particularly preferred amines of subgroup ($c_1$) are 2,6-dialkylanilines and compounds of the formula (II)

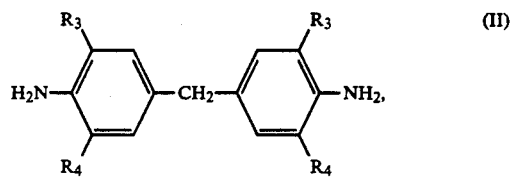

in which $R_3$ is chlorine or $C_1-C_3$alkyl, and $R_4$ is hydrogen or $C_1-C_3$alkyl, in particular 2,6-diisopropylaniline, and compounds of the formula (II) in which $R_3$ and $R_4$, independently of one another, are $C_1-C_3$alkyl, preferably ethyl or isopropyl.

Examples of particularly suitable amines of subgroup (c₁) are 2,6-diisopropylaniline, 3-amino-2,4-diethyl-6-methylaniline, bis(4-amino-3,5-diethylphenyl)methane, bis(4-amino-3-methyl-5-isopropylphenyl)methane, bis(4-amino-3,5-diisopropylphenyl)methane, bis(4-amino-3-ethyl-5-methylphenyl)methane, bis(4-amino-3,5-diethylphenyl)methane, bis(4-amino-3-methylphenyl)methane and bis(4-amino-3-chlorophenyl)methane.

The ortho- and para-substituents relative to the amino group of subgroup (c₂) are electron-withdrawing groups.

If the radical R in accordance with the definition of the amines (c₂) is $C_1$-$C_{10}$alkyl, $C_5$-$C_6$cycloalkyl or $C_6$-$C_{10}$aryl, the comments made above for the corresponding substituents of the amines of subgroup (c₁) apply to this radical.

Aminoaryl R is preferably aminoaryl having 6 to 10 ring carbon atoms, e.g. aminonaphthyl or aminophenyl, such as 1-amino-4-naphthyl, 2-amino-6-naphthyl, 2-amino-7-naphthyl, or 2-, 3- or in particular 4-aminophenyl.

If R is an —R'—OOC—$C_6H_4NH_2$ group, R' is preferably $C_2$-$C_{10}$alkylene, and the amino group is preferably in the para-position on the phenyl ring.

Preferred amines from subgroup (c₂) are compounds containing one or two $NH_2$ groups and having a $pK_a$ value of 2-3.5. Examples of preferred compounds are anthranilic acid and compounds of the formula (III)

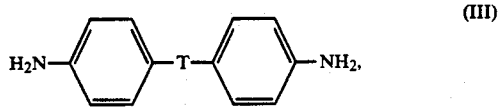

in which T is CO, SO or in particular $SO_2$ or —COO(CH₂)$_m$OOC— where m=2-6, preferably 2.

Examples of suitable compounds are 4-aminobenzoic acid, anthranilic acid, bis(4-aminophenyl) sulfone, bis(4-aminophenyl) sulfoxide, bis(4-aminophenyl) ketone and 1,3-propanediol bis(4-aminobenzoate).

Amines may be present as such in the curable composition or may alternatively be prereacted with an epoxy resin. This prereaction is preferably carried out at elevated temperature, for example at 100°-200° C. The abovementioned variant of the invention may be expedient, for example, if the cationically polymerisable material employed is an epoxy resin. However, preferred embodiments of the invention are those in which the amines are employed without prereaction with an epoxy resin.

The polymerisation inhibitor c) may according to the invention only be employed in an amount which is so low that the composition contains an excess of initiator which is sufficient for curing the material. Preferably, the excess of initiator ranges from at least 0.05 to 5% by weight, based on the cationically polymerizable material. The excess may, however, be even higher. If conventional amounts of initiator are used, the inhibitor is employed in an amount which is considerably less than the amount equivalent to the free cations or acid protons which can be formed by the initiator. Thus, the polymerisation inhibitor can be employed, for example, in an amount of from 0.01 to 0.5 equivalents, based on an initiator of the formula (I) or on the onium groups of an onium initiator, and is particularly expediently employed in an amount of from 0.01 to 0.15 equivalents.

Component a) in the compositions according to the invention may be any conventional cationically polymerisable organic material, for example one of those listed below, it being possible for these materials to be employed alone or as mixtures of at least two components:

I. Ethylenically unsaturated compounds which can be polymerised by a cationic mechanism. These include 1. Monoolefins and diolefins, e.g. isobutylene, butadiene, isoprene, styrene, α-methylstyrene, divinylbenzenes, N-vinylpyrrolidone, N-vinylcarbazole and acrolein.

2. Vinyl ethers, e.g. methyl vinyl ether, isobutyl vinyl ether, trimethylolpropane trivinyl ether, ethylene glycol divinyl ether; cyclic vinyl ethers, e.g. 3,4-dihydro-2-formyl-2H-pyran (dimeric acrolein) and the 3,4-dihydro-2H-pyran-2-carboxylic acid ester of 2-hydroxymethyl-3,4-dihydro-2H-pyran.

3. Vinyl esters, e.g. vinyl acetate and vinyl stearate.

II. Cationically polymerisable heterocyclic compounds, e.g. ethylene oxide, propylene oxide, epichlorohydrin, glycidyl ethers of monohydric alcohols or phenols, e.g. n-butyl glycidyl ether, n-octyl glycidyl ether, phenyl glycidyl ether and cresyl glycidyl ether; glycidyl acrylate, glycidyl methacrylate, styrene oxide and cyclohexene oxide; oxetanes, such as 3,3-dimethyloxetane and 3,3-di(chloromethyl)oxetane; tetrahydrofuran; dioxolanes, trioxane and 1,3,6-trioxacyclooctane; lactones, such as β-propiolactone, γ-valerolactone and ε-caprolactone; thiiranes, such as ethylene sulfide and propylene sulfide; epoxy resins; linear and branched polymers containing glycidyl groups in the side chains, e.g. homopolymers and copolymers of polyacrylate and polymethacrylate glycidyl esters.

Of the abovementioned polymerisable compounds, particular importance is attached to the epoxy resins, in particular difunctional and polyfunctional epoxides, and epoxy resin prepolymers of the type used for the preparation of crosslinked epoxy resins. The diepoxides and polyepoxides may be aliphatic, cycloaliphatic or aromatic compounds. Examples of such compounds are the glycidyl ethers and β-methylglycidyl ethers of aliphatic or cycloaliphatic diols or polyols, for example those of ethylene glycol, propane-1,2-diol, propane-1,3-diol, butane-1,4-diol, diethylene glycol, polyethylene glycol, polypropylene glycol, glycerol, trimethylolpropane or 1,4-dimethylolcyclohexane, or of 2,2-bis(4-hydroxycyclohexyl)propane, the glycidyl ethers of diphenols and polyphenols, for example resorcinol, 4,4'-dihydroxydiphenylmethane, 4,4'-dihydroxydiphenyl-2,2-propane, novolaks and 1,1,2,2-tetrakis-(4-hydroxyphenyl)ethane.

Further glycidyl compounds of industrial importance are the glycidyl esters of carboxylic acids, in particular di- and polycarboxylic acids. Examples of these are the glycidyl esters of succinic acid, adipic acid, azelaic acid, sebacic acid, phthalic acid, terephthalic acid, tetra- and hexahydrophthalic acid, isophthalic acid or trimellitic acid, or of dimerised fatty acids.

Examples of polyepoxides which are different from glycidyl compounds are the diepoxides of vinylcyclohexene and dicyclopentadiene, 3-(3',4'-epoxycyclohexyl)-8,9-epoxy-2,4-dioxaspiro[5.5]undecane, 3',4'-epoxycyclohexylmethyl 3,4-epoxycyclohexanecarboxylate, butadiene diepoxide or isoprene diepoxide, epoxidised linoleic acid derivatives or epoxidised polybutadiene.

Preferred epoxy resins are unmodified or preextended diglycidyl ethers of dihydric phenols or dihydric aliphatic alcohols having 2 to 4 carbon atoms. The epoxy resins are preferably flowable below the temperature at which curing commences. Very particular preference is given to the unmodified or pre-extended diglycidyl ethers of 2,2-bis(4-hydroxyphenyl)propane and bis(4-hydroxyphenyl)methane or mixtures of these epoxy resins.

Other suitable cationically polymerisable compounds are phenolic resins.

Preferred phenolic resins are resols prepared from a phenol and an aldehyde. Suitable phenols include phenol itself, resorcinol, 2,2-bis(p-hydroxyphenyl)propane, p-chlorophenol, phenol which is substituted by one or two alkyl groups, each having 1 to 9 carbon atoms, such as o-, m- and p-cresol, the xylenols, p-tert-butylphenol and p-nonylphenol, and phenyl-substituted phenols, in particular p-phenylphenol. The aldehyde condensed with the phenol is preferably formaldehyde, but other aldehydes, such as acetaldehyde and furfural, are also suitable. If desired, a mixture of curable phenol-aldehyde resins of this type can be used.

Preferred resols are products of the condensation of phenol, p-chlorophenol, resorcinol or o-, m- or p-cresol with formaldehyde.

The onium initiators which can be used according to the present invention for the cationic polymerisation are likewise all compounds conventionally known for this purpose. As is known, these are salt-like compounds which contain one or more cationic centres in the form of coordinatively saturated atoms from main group five, six or seven of the Periodic Table and counteranions of lowest possible nucleophilicity, e.g. appropriate ammonium, phosphonium, sulfonium, sulfoxonium, selenium, iodonium or bromonium compounds. The cationic centre of the compounds may also be part of a cyclic structure unit of the initiator compound. Onium initiators like those mentioned have already been described in large number in the literature. In this respect, reference is made to the following documents without this being taken as a restriction to the onium initiator types specifically described in these documents: U.S. Pat. No. 4,058,400, U.S. Pat. No. 4,058,401, U.S. Pat. No. 4,069,055, U.S. Pat. No. 5,013,814; PCT Application WO 90/11 303JP 58/037 003 A2, JP 58/037 004 A2.

Polymerisation initiators such as those of the formula (I) are described in EP-A-0 388 837, to which express reference is likewise made. The preferences given in this document regarding the formula (I) also apply to the present invention.

Compositions according to the invention in which component b) is a sulfonium salt initiator containing one or more sulfonium salt groups in the molecule are generally preferred. This applies in particular to thermocurable compositions in which the initiators are mono-, di- or tri(arylalkyl)sulfonium compounds, preferred arylalkyl radicals being identical or different radicals of the formula Ar—CH$_2$— in which Ar is, for example, phenyl or naphthyl which is unsubstituted or monosubstituted or polysubstituted by C$_1$–C$_8$alkyl, alkoxy, in particular C$_1$–C$_4$alkoxy, halogen, hydroxyl, nitro, phenyl, phenoxy, alkoxycarbonyl, in particular having 1–4 carbon atoms in the alkoxy radical, or acyl having 1–12 carbon atoms, and the other radicals on the sulfonium sulfur are, independently of one another, for example C$_1$–C$_{12}$alkyl, C$_3$–C$_8$cycloalkyl, C$_4$–C$_{10}$cycloalkylalkyl or phenyl which is unsubstituted or monosubstituted or polysubstituted by C$_1$–C$_8$alkyl, alkoxy, in particular C$_1$–C$_4$alkoxy, halogen, hydroxyl, nitro, phenyl, phenoxy, alkoxycarbonyl, in particular having 1–4 carbon atoms in the alkoxy radical, or acyl having 1–12 carbon atoms. Examples of less-nucleophilic counteranions are anions having the structure Z(Hal)$_k$ of various negative charge, in which Z is a metal or metalloid, Hal is halogen, in particular fluorine or chlorine, and k is an integer from 4 to 6. Examples are BF$_4^-$, PF$_6^-$, AsF$_6^-$, SbF$_6^-$, BiCl$_5^-$ etc. One or more of the halogen atoms of this anion type may also be replaced by hydroxyl groups. An example of these anions is SbF$_5$(OH)$^-$. Other suitable anions are fluorinated, in particular perfluorinated, alkylsulfonate anions, such as CF$_3$SO$_3^-$. Very particularly preferred anions are SbF$_6^-$, AsF$_6^-$ and SbF$_5$(OH)$^-$.

Compositions containing sulfonium initiators of the formula (IV), (V), (VI) or (VII) have particularly good properties:

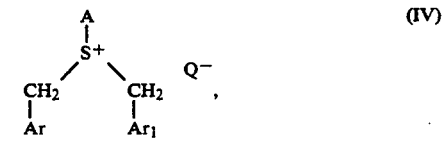

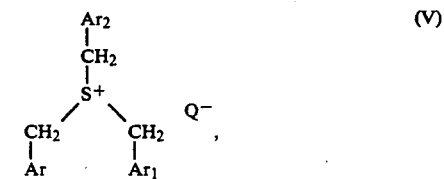

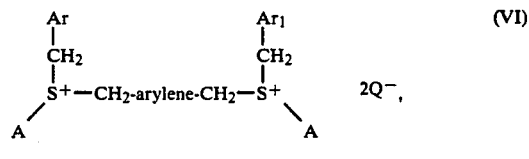

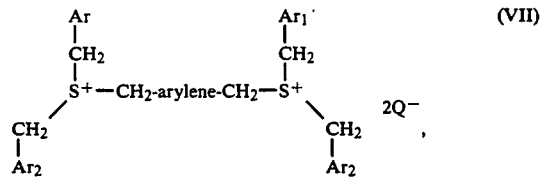

in which A is C$_1$–C$_{12}$alkyl, C$_3$–C$_8$cycloalkyl, C$_4$–C$_{10}$cycloalkylalkyl or phenyl which is unsubstituted or monosubstituted or polysubstituted by C$_1$–C$_8$alkyl, C$_1$–C$_4$alkoxy, halogen, hydroxyl, nitro, phenyl, phenoxy, alkoxycarbonyl having 1–4 carbon atoms in the alkoxy radical or acyl having 1–12 carbon atoms, Ar, Ar$_1$ and Ar$_2$, independently of one another, are each phenyl or naphthyl which is unsubstituted or monosubstituted or polysubstituted by C$_1$–C$_8$alkyl, C$_1$–C$_4$alkoxy, halogen, hydroxyl, nitro, phenyl, phenoxy, alkoxycarbonyl having 1–4 carbon atoms in the alkoxy radical or acyl having 1–12 carbon atoms, arylene is in each case phenylene or naphthylene which is unsubstituted or monosubstituted or polysubstituted by C$_1$–C$_8$alkyl, C$_1$–C$_4$alkoxy, halogen, hydroxyl, nitro, phenyl, phenoxy, alkoxycarbonyl having 1–4 carbon atoms in the alkoxy radical or acyl having 1–12 carbon atoms, and Q$^-$ is SbF$_6^-$, AsF$_6^-$ or SbF$_5$OH$^-$.

Of these, particular preference is given to the compositions containing sulfonium initiators of the formula (IV) or (V) in which A is C$_1$–C$_{12}$alkyl or phenyl which is unsubstituted or substituted by halogen or C$_1$–C$_4$alkyl, Ar, Ar$_1$ and Ar$_2$, independently of one another, are each phenyl which is unsubstituted or monosubstituted or polysubstituted by $C_1$-$C_8$alkyl, $C_1$-$C_4$alkoxy, Cl or Br, and $Q^-$ is $SbF_5OH^-$ or in particular $AsF_6^-$ or $SbF_6^-$. Very particular preference is given to dibenzylphenylsulfonium salts.

The amount of initiator compound is generally from 0.05 to 20% by weight, preferably from 1 to 15% by weight, in particular from 1 to 5% by weight, based on the cationically polymerisable organic material.

In a specific embodiment of the invention, the compositions contain, as a further component d), an inert solvent or dispersing agent for the curing initiator. Preferred solvents are the diesters of aromatic dicarboxylic acids, in particular dibutyl phthalate.

It is also possible for the compositions according to the invention, in particular if the cationically polymerisable compound is an epoxy resin, to contain further thermal curing agents, for example polycarboxylic acids, polycarboxylic anhydrides or polyphenols which do not adversely affect the cationic curing by means of sulfonium salts. The proportion of a curing agent of this type is less than the amount of the further curing agent which is stoichiometrically necessary for complete curing of the cationically polymerisable organic material.

In addition, the compositions according to the invention may contain further compounds which can be copolymerised with the cationically polymerisable organic material used, for example cyclic ethers or cyclic lactones, such as ε-caprolactone, γ-butyrolactone or tetrahydrofurfuryl alcohol. If copolymerisable compounds are used, their proportion is generally between 1 and 50% by weight, based on the amount of cationically polymerisable organic material used, and the amount of curing catalyst is generally from 0.05 to 20% by weight, based on the amount of cationically polymerisable organic material used and the amount of copolymerisable compound.

The compositions may also contain known additives which are usually employed in polymerisable materials. Examples of such additives are coinitiators, e.g. secondary or tertiary diols, pigments, dyes, fillers, such as talc, kaolin, mica, gypsum, titanium dioxide, quartz sand, cellulose, clay, ground dolomite, wollastonite, siliceous earth having a large specific surface area (Aerosil ®), powdered polyvinyl chloride, polyolefins, and metal powders, such as copper, silver, aluminium or iron powder, reinforcing agents, glass fibres and other fibres, flame inhibitors, such as antimony trioxide, and antistatics, flow-control agents, antioxidants and light stabilisers.

Addition of aluminium oxide trihydrate to the compositions according to the invention, preferably in an amount of from 50 to 70% by weight, based on the total composition, results in surprisingly good flameproofing of the compositions. The invention therefore also relates to corresponding compositions. However, the aluminium oxide trihydrate must be sufficiently alkali-free to allow curing of the material.

The polymerisation inhibitors can be added at any time before, even immediately before, the initiator component and the polymerisable material are combined. They react virtually immediately with the initiator decomposition products thus introduced into the composition or formed thereafter, so that the decomposition products have no effect as non-latent curing agents for the polymerisable material.

Some polymerisation inhibitors also increase the temperature necessary for initiation of curing. This is tantamount to an increase in the thermal stability of the composition. Examples of such inhibitors are tribenzylamine, bis(4-amino-3-ethyl-5-methylphenyl)methane, 1,8-diazabicyclo[5.4.0]undec-7-ene and 1,5-diazabicyclo[4.3.0]non-5-ene, which exhibit the effect, in particular, when sulfonium initiators are used. Such substances can easily be identified by means of DSC measurements from the shift to higher temperatures of the beginning of the curing peak compared with identical compositions without inhibitor. Said compositions can be processed at higher temperatures than corresponding inhibitor-free compositions and handled for significantly longer at a given temperature than can the latter. If inhibitors of said type are added in increasing amounts to a certain composition, a greater and greater increase in the temperature necessary for curing initiation can generally be achieved. It thus becomes possible to control the thermal stability of the compositions within broad limits. However, since the inhibitor is only present in the compositions according to the invention in a proportion which is equivalent to a fraction of the total amount of initiator present and since it reacts virtually completely before reaction of the polymerisable material commences, the actual curing of the composition, which is effected in the end by excess initiator, is no longer influenced by addition of the inhibitor. This can be seen in the DSC diagram from the fact that the exothermicity maximum of the curing reaction is shifted to an insignificant extent, or not at all.

Examples of polymerisation inhibitors which only exhibit the above-outlined effect to a minimal extent, or not at all, are 1-methylimidazole, 1,4-diazabicyclo[2.2.2]octane and 3-amino-2,4-diethyl-6-methylaniline.

The temporary increase in the thermal stability caused by the novel use of polymerisation inhibitors may of course also be advantageous if the compositions in question are freshly prepared and storage thereof is not planned or is less difficult than in the case of solid compositions. Thus, the present invention can advantageously be used, for example, in the preparation of fibre composites. Here, compositions according to the invention enable the matrix resins to be heated to a greater extent, for a limited time, during application without any risk, which reduces the viscosity and thus improves the penetration of the fibre material by the matrix or, for example, allows the use of less or even no diluent or solvent in the composition. Hotter and thus less viscous casting resins can likewise considerably simplify the filling of casting moulds which have complicated and fine structures. In exactly the same way, the thermal homogenisation of solid one-component systems, for example of powder coating mixtures or heat-curing solid adhesive compounds, can be accomplished better and more reliably, as already shown in the introduction, if compositions are used which are thermally very stable.

If the present invention is applied to two-component compositions, i.e. with separate preparation and storage of the component containing the initiator and the component containing the cationically polymerisable organic material, the polymerisation inhibitor is expediently added to the component containing the polymerisable material.

The invention therefore also relates to an initiator-free subcomponent for the preparation of one of the above-described compositions, which comprises at least the following components:

a) a cationically polymerisable organic material and c) a polymerisation inhibitor as described above.

The amount of polymerisation inhibitor in this subcomponent can vary, but will generally be between 0.01 and 5% by weight, based on the resin. For curing, initiator must be added to this subcomponent in such an amount that an excess of initiator, with respect to the amount of inhibitor, which is sufficient for curing the material is present in the finished composition.

The invention furthermore relates to a process for the preparation of a composition according to the invention, in which A) at least one initiator for cationic polymerisation in the form of an onium compound or a compound of the formula (I) is homogeneously mixed with a solvent or dispersing agent which is suitable for the initiator.

B) at least one polymerisation inhibitor, as described above, is homogeneously mixed as component c) with the cationically polymerisable organic material, C) the submixtures obtained in steps A) and/or B) are, if desired, subjected to interim storage, and D) the two submixtures are mixed with one another.

In addition, molecular sieve materials, in particular zeolites, may, if desired, be added to a solvent-containing initiator component since they can slow deactivation of the initiator due to decomposition by, inter alia, absorbing the residual water in this component. The shelf life of the curing agent can be additionally extended in this way. The zeolite material preferably has a particle size of from about 3 to 5 $\mu$m and a pore size of from 0.3 to 0.7 nm and can be used, for example, in an amount of from 0.1 to 20% by weight, in particular from 0.1 to 10% by weight, based on the curing initiator.

The compositions according to the invention can in principle be obtained in any desired form, for example as homogeneous liquid mixtures or in homogeneous or inhomogeneous glassy form. Homogeneous glassy products can be obtained in a manner known per se, for example by liquefying solid cationically polymerisable organic materials, if desired with addition of suitable solvents, heating to temperatures above their glass transition temperature, adding inhibitor and initiator, and cooling the resultant mixtures.

The mixtures according to the invention can be cured rapidly at relatively low temperatures. Preference is given to compositions which can be cured at temperatures between 45° and 150° C. The exothermicity maximum of the curing reaction of the compositions is preferably below 140° C., even better below 130° C. It should very particularly preferably be at most 115° C. The exothermicity maximum can be determined in a conventional manner, for example using a differential scanning calorimeter. It is also possible to first precure the mixtures according to the invention at relatively low temperatures until gelling of the curable composition occurs, before completing curing at elevated temperatures.

The final curing is generally accompanied by shaping to give mouldings, impregnations, coatings or adhesive bonds.

The compositions according to the invention can be employed very generally for the production of cured products and can be employed in the formulation matched to the particular area of application in each case, for example as coating compositions, surface coatings, including powder coatings, compression moulding compounds, dipping resins, casting resins, impregnating resins, laminating resins, 1- or 2-component adhesives or matrix resins, in particular for encapsulating and impregnating articles.

The use of thermocurable compositions according to the invention, also in the form of a low-pressure compound, for impregnating and/or encapsulating articles, in particular electrical high- or low-voltage components or electronic components, is particularly preferred and therefore likewise forms a subject-matter of the invention.

The invention furthermore relates to the use of compositions according to the invention as liquid or solid coating compositions, for example as surface coating or powder coating mixtures, to the use for the preparation of low-pressure epoxy moulding compounds (LPMCs), to the use of the compositions as a part of composite systems for circuit boards or as a matrix for fibre composites, and finally to the use of the compositions described as heat-curing adhesives.

The products obtained from the mixtures according to the invention by thermal curing have high heat resistance and are solid, insoluble and infusible, three-dimensionally crosslinked products.

EXAMPLE 1

0.011 part by weight of 1-methylimidazole is dissolved at room temperature in 36 parts by weight of a mixture of bisphenol A diglycidyl ether resin and bisphenol F diglycidyl ether resin. 0.4 part of glycidoxypropyltrimethoxysilane (SILAN® 187 A) is then homogenised in under identical conditions, and quartz (Novacite® 1250) is added in portions. A curing agent solution comprising 3.2 parts by weight of dibutyl phthalate and 0.4 part by weight of dibenzylphenylsulfonium hexafluoroantimonate, which dissolves at 70° C., are added to this resin formulation. A material of this type has a pot life of several hours at room temperature. A corresponding mixture without 1-methylimidazole has a significantly shorter pot life.

EXAMPLES 2 to 9

In each case, 10 mol % of the inhibitor indicated, based on the amount of catalyst present in the composition, are added to an epoxy resin based on a mixture of bisphenol A and bisphenol F and having a viscosity of 6500–8000 mPa.s (at 25° C. in accordance with DIN 53 015) and an epoxide equivalent weight of 172–182 g/eq (ARALDIT® PY 302-²). As curing agent, one part by weight of a solution of 10% by weight of dibenzylphenylsulfonium hexafluoroantimonate in dibutyl phthalate is added to 9 parts by weight of the resin. The DSC diagram shows the temperatures given in the table below for commencement of the (exothermic) curing reaction and for the exothermicity maximum and the total energy.

| Inhibitor | Commencement of curing [°C.] | Exothermicity maximum [°C.] | Total energy [J/g] |
|---|---|---|---|
| Tribenzylamine | 90 | 98 | 534 |
| Bis(4-amino-3-ethyl-5-methylphenyl)methane | 80 | 98 | 534 |
| 1,8-Diazabicyclo-[5.4.0]undec-7-ene | 77 | 98 | 528 |
| 1,5-Diazabicyclo-[4.3.0]non-5-ene | 75 | 99 | 536 |
| 1-Methylimidazole | 65 | 98 | 530 |
| 1,4-Diazabicyclo-[2.2.2]octane | 60 | 98 | 538 |

-continued

| Inhibitor | Commencement of curing [°C.] | Exothermicity maximum [°C.] | Total energy [J/g] |
| --- | --- | --- | --- |
| 3-Amino-2,4-diethyl-6-methylaniline | 63 | 94 | 541 |
| Tetrabutylammonium hydrogen sulfate | 82.4 | 101.8 | 502 |

Curing commences sharply in each case at the stated temperature. Premature curing or an increase in the viscosity of the compositions is not evident for a pot life at room temperature of several hours. The examples also make it clear that the temperature at which curing begins can be controlled using different polymerisation inhibitors in an otherwise identical composition.

EXAMPLES 10 to 12

In each case, 17.3 mg of 1-methylimidazole as inhibitor are added per 100 g of resin to an epoxy resin based on a mixture of bisphenol A and bisphenol F having a viscosity of 6500–8000 mPa.s (at 25° C. according to DIN 53 015) and an epoxide equivalent weight of 172–182 g/eq (ARALDIT® PY 302-²). As curing agent, one part of a solution of 10% by weight of the stated initiator in dibutyl phthalate is added to 9 parts by weight of the resin. The DSC diagram shows the properties indicated in the table below.

| Initiator | Commencement of curing [°C.] | Exothermicity maximum [°C.] | Total energy [J/g] |
| --- | --- | --- | --- |
| Dibenzylphenylsulfonium hexafluoroantimonate | 65 | 98 | 524 |
| Benzylethylphenylsulfonium hexafluoroantimonate | 83 | 119 | 497 |
| Tris(pentamethylbenzyl)sulfonium hexafluoroantimonate | 61 | 77 | 512 |

Curing begins sharply in each case at the stated temperature. Premature curing or an increase in the viscosity of the compositions is not evident for a pot life at room temperature of several hours.

EXAMPLES 13 to 19

A resin component of the following composition is prepared:
37.36% by weight of ARALDIT® PY 302-² (epoxy resin based on a mixture of bisphenol A and bisphenol F and having a viscosity of 6500–8000 mPa.s (at 25° C. in accordance with DIN 53 015) and an epoxide equivalent weight of 172–182 g/eq
0.01% by weight of 1-methylimidazole
0.31% by weight of SILAN® 187 A (glycidoxypropyltrimethoxysilane)
0.05% by weight of a conventional silicone-free antifoaming agent
0.10% by weight of BENTONE® SD2 (organomodified montmorillonite)
62.17% by weight of APYRAL® 2E (aluminium oxide trihydrate)

The initiators indicated in the table below are dissolved or dispersed in dibutyl phthalate (DBP) in the concentration indicated in each case. In each case, 3.78 parts by weight of this solution are mixed with 100 parts of the abovementioned resin component. The DSC diagram shows the values indicated in the table below.

| Initiator (% by weight in DBP) | Commencement of curing [°C.] | Exothermicity maximum [°C.] | Total energy [J/g] |
| --- | --- | --- | --- |
| Dibenzylphenylsulfonium hexafluoroantimonate (15.6) | 86 | 108 | 190 |
| Tris(2,4,6-trimethylbenzyl)sulfonium hexafluoroantimonate (20.3) | 59 | 79 | 191 |
| Bis(pentamethylbenzyl)-dodecylsulfonium hexafluoroantimonate (22.5) | 67 | 85 | 140 |
| Bis(4-chlorobenzyl)-4-chlorophenylsulfonium hexafluoroantimonate (18.7) | 69 | 91 | 196 |
| Dibenzyl(4-methoxyphenyl)sulfonium hexafluoroantimonate (16.5) | 105 | 132 | 164 |
| Dibenzyl(4-hydroxyphenyl)sulfonium hexafluoroantimonate (16.5) | 104 | 137 | 189 |
| Hexa(methylhexahydrophthalic anhydride)-iron(II) hexafluoroantimonate (11.4) | 50 | 98 | 183 |

EXAMPLES 20-22

A resin component is prepared from the cationically polymerisable material indicated in the table below and 1-methylimidazole (17.3 mg/100 g of polymerisable material). 9 parts by weight of the resin component are in each case mixed with one part by weight of curing agent component (10% solution of dibenzylphenylsulfonium hexafluoroantimonate in dibutyl phthalate). The DSC diagram shows the temperatures, indicated in the table below, for the beginning of the (exothermic) curing reaction, for the exothermicity maximum and the total energy of the curing reaction.

| Polymerisable material | Commencement of curing [°C.] | Exothermicity maximum [°C.] | Total energy [J/g] |
| --- | --- | --- | --- |
| 1,4-Bis(vinyloxymethyl)cyclohexane (RAPICURE® CHVE) | 74 | 86.6 | 432 |
| Styrene | 94 | 106 | 492 |

| Polymerisable material | Commencement of curing [°C.] | Exothermicity maximum [°C.] | Total energy [J/g] |
|---|---|---|---|
|  | 65 | 80 | 587 |

EXAMPLES 23 and 24

A composition comprising 1% by weight of the initiator indicated in each case in the table below, the stated amounts of tribenzylamine and a solid epoxy resin powder, ARALDIT® GT 7004 (softening point 95°-101° C., epoxide equivalent weight 715-750 g/eq), as the remainder is finely powdered and mixed in a mixer. The DSC diagram shows the temperatures, indicated in the table below, for the commencement of the (exothermic) curing reaction, for the exothermicity maximum and the total energy.

| Initiator/ % by weight of tribenzylamine | Commencement of curing [°C.] | Exothermicity maximum [°C.] | Total energy [J/g] |
|---|---|---|---|
| Dibenzylphenyl-sulfonium hexafluoroantimonate/0.1 | 95 | 114 | 90 |
| Tris(4-methylbenzyl)-sulfonium hexafluoroantimonate/0.05 | 118 | 137 | 120 |

What is claimed is:

1. A thermocurable composition which comprises at least the following components:
   a) a cationically polymerisable organic material,
   b) an initiator for cationic polymerisation in the form of an onium compound or a compound of the formula (I)

$$[M^{+n}(L)_x]^{n+} nX^-  \qquad (I),$$

in which n is 2 or 3, M is a metal cation selected from the group consisting of $Zn^{2+}$, $Mg^{2+}$, $Fe^{2+}$, $Co^{2+}$, $Ni^{2+}$, $Cr^{2+}$, $Ru^{2+}$, $Mn^{2+}$, $Sn^{2+}$, $VO^{2+}$, $Fe^{3+}$, $Al^{3+}$ and $Co^{3+}$, $X^-$ is an anion selected from the group consisting of $PF_6^-$, $AsF_6^-$, $SbF_6^-$, $BiF_6^-$, derivatives of these anions in which at least one fluorine atom has been replaced by a hydroxyl group, and $CF_3SO_3^-$, or in which up to 50% of the anions $X^-$, based on the total amount of anions, may be any desired anions, L is water or an organic σ-donor ligand which contains, as bonding sites, one or more functional radicals selected from the group comprising —CO—, —CO—O—, —O—CO—O— and —O— and forms σ-bonds with the central atom via the oxygen atom or atoms, and x is an integer from 0 to 6, and where the ligands L may be different within said definitions,
   c) a stabilizing effective amount of a polymerisation inhibitor which is otherwise present in such a small amount that sufficient initiator b) unaffected by it remains to effect the desired curing of the composition.

2. A composition according to claim 1, in which component c) is a Brönsted base whose strength corresponds to a $pK_a$ value of from 2 to 12 (at 25° C. in water).

3. A composition according to claim 1, in which component c) is an amine.

4. A composition according to claim 3, which contains a tertiary amine.

5. A composition according to claim 3, which contains an amine selected from the group consisting of:
   (c1) aromatic amines containing one to four $NH_2$ groups and having at least one substituent in the ortho-position to each amino group, where the substituent is $C_1$-$C_{10}$alkyl, $C_1$-$C_{10}$alkoxy, $C_5$-$C_6$-cycloalkyl, $C_6$-$C_{10}$aryl or halogen, with the proviso that the amine is not halogen-substituted in both ortho-positions to an amino group, and
   (c2) aromatic amines containing 1 to 4 $NH_2$ groups and having one ortho- or para-substituent to each amino group present, where the substituent is —COOH, —COOR, —COR, —$SO_2$R or —SOR, and R is $C_1$-$C_{10}$alkyl, $C_5$-$C_6$cycloalkyl, $C_6$-$C_{10}$aryl, aminoaryl or —R'—OOC—$C_6H_4$—$NH_2$ where R' is alkylene.

6. A composition according to claim 3, in which the amine has a $pK_a$ value of from 2 to 9.

7. A composition according to claim 1, in which the polymerisation inhibitor is present in an amount of from 0.01 to 0.5 equivalents, preferably from 0.01 to 0.15 equivalents, based on the onium groups in the initiator.

8. A composition according to claim 1, in which component a) is a difunctional or polyfunctional epoxy resin.

9. A composition according to claim 1, in which component b) is a sulfonium salt initiator.

10. A composition according to claim 9, in which the sulfonium salt initiator is a compound of the formula (IV), (V), (VI) or (VII):

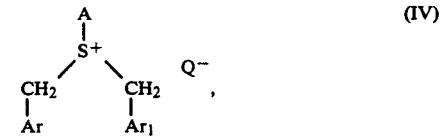 (IV)

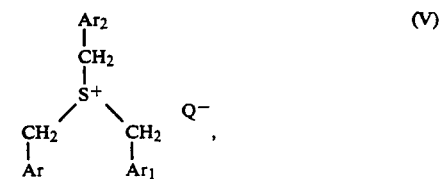 (V)

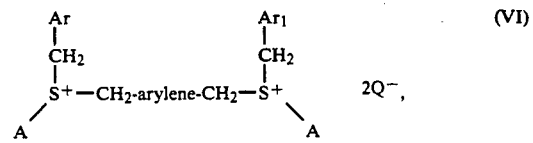 (VI)

-continued

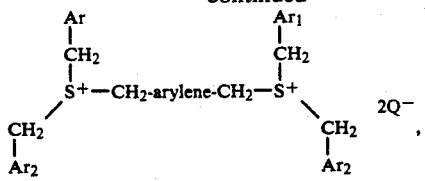
(VII)

in which A is $C_1$-$C_{12}$alkyl, $C_3$-$C_8$cycloalkyl, $C_4$-$C_{10}$cycloalkylalkyl or phenyl which is unsubstituted or monosubstituted or polysubstituted by $C_1$-$C_8$alkyl, $C_1$-$C_4$alkoxy, halogen, hydroxyl, nitro, phenyl, phenoxy, alkoxycarbonyl having 1-4 carbon atoms in the alkoxy radical or acyl having 1-12 carbon atoms, Ar, $Ar_1$ and $Ar_2$, independently of one another, are each phenyl or naphthyl which is unsubstituted or monosubstituted or polysubstituted by $C_1$-$C_8$alkyl, $C_1$-$C_4$alkoxy, halogen, hydroxyl, nitro, phenyl, phenoxy, alkoxycarbonyl having 1-4 carbon atoms in the alkoxy radical or acyl having 1-12 carbon atoms, arylene is in each case phenylene or naphthylene which is unsubstituted or monosubstituted or polysubstituted by $C_1$-$C_8$alkyl, $C_1$-$C_4$alkoxy, halogen, hydroxyl, nitro, phenyl, phenoxy, alkoxycarbonyl having 1-4 carbon atoms in the alkoxy radical or acyl having 1-12 carbon atoms, and $Q^-$ is $SbF_6^-$, $AsF_6^-$ or $SbF_5OH^-$.

11. A composition according to claim 10, in which component b) is a sulfonium initiator of the formula (IV) or (V) in which A is $C_1$-$C_{12}$alkyl or phenyl which is unsubstituted or substituted by halogen or $C_1$-$C_4$alkyl, Ar, $Ar_1$ and $Ar_2$, independently of one another, are each phenyl which is unsubstituted or monosubstituted or polysubstituted by $C_1$-$C_8$alkyl, $C_1$-$C_4$alkoxy, Cl or Br, and $Q^-$ is $SbF_5OH^-$, $AsF_6^-$ or $SbF_6^-$.

12. A composition according to claim 1, in which a further component d) is a solvent or dispersing agent for the initiator.

13. A composition according to claim 1, in which aluminium oxide hydrate is present in an amount of from 50 to 70% by weight, based on the total composition.

14. A process for the preparation of a composition according to claim 1, in which
    A) at least one initiator for cationic polymerisation in the form of an onium compound or a compound of the formula (I) is homogeneously mixed with a solvent or dispersing agent which is suitable for the initiator,
    B) at least one polymerisation inhibitor, as described above, is homogeneously mixed as component c) with the cationically polymerisable organic material,
    C) the submixtures obtained in steps A) and/or B) are, if desired, subjected to interim storage, and
    D) the two submixtures are mixed with one another.

* * * * *